US009381726B2

(12) United States Patent
Lee et al.

(10) Patent No.: US 9,381,726 B2
(45) Date of Patent: Jul. 5, 2016

(54) METHOD FOR PACKAGING SECONDARY OPTICAL ELEMENT

(71) Applicant: ATOMIC ENERGY COUNCIL-INSTITUTE OF NUCLEAR ENERGY RESEARCH, Taoyuan County (TW)

(72) Inventors: Yueh-Mu Lee, Taoyuan County (TW); Zun-Hao Shih, Taoyuan County (TW); Yi-Ping Liang, Taoyuan County (TW); Hwa-Yuh Shin, Taoyuan County (TW); Hwen-Fen Hong, Taoyuan County (TW)

(73) Assignee: Atomic Energy Council—Institute of Nuclear Energy Research, Taoyuan County (TW)

( * ) Notice: Subject to any disclaimer, the term of this patent is extended or adjusted under 35 U.S.C. 154(b) by 154 days.

(21) Appl. No.: 14/451,516

(22) Filed: Aug. 5, 2014

(65) Prior Publication Data

US 2016/0039190 A1    Feb. 11, 2016

(51) Int. Cl.
*H01L 31/054* (2014.01)
*H01L 31/18* (2006.01)
*B32B 37/12* (2006.01)
*B32B 37/18* (2006.01)
*B32B 37/02* (2006.01)
*B32B 38/18* (2006.01)
*H05K 13/04* (2006.01)

(52) U.S. Cl.
CPC ............... *B32B 37/12* (2013.01); *B32B 37/02* (2013.01); *B32B 37/18* (2013.01); *B32B 38/18* (2013.01); *H01L 31/0543* (2014.12); *H01L 31/18* (2013.01); *H05K 13/0469* (2013.01); *B32B 2307/40* (2013.01); *B32B 2457/00* (2013.01); *B32B 2457/12* (2013.01)

(58) Field of Classification Search
CPC .................................................. H01L 31/0543
See application file for complete search history.

(56) References Cited

U.S. PATENT DOCUMENTS

2013/0146120 A1*  6/2013  Seel ................. H01L 31/0524
                                                                136/246
2014/0048128 A1*  2/2014  Meitl ................ H01L 31/0525
                                                                136/259
2015/0179854 A1*  6/2015  Lee .................. H01L 31/0543
                                                                136/259

* cited by examiner

Primary Examiner — Jeff Aftergut
(74) Attorney, Agent, or Firm — Rosenberg, Klein & Lee

(57) ABSTRACT

The present invention relates to a method for packaging secondary optical element. By coating optical glue on the bottom surface of the secondary optical element and on the substrate and by hardening individually, as well as using the technical characteristics of flipping the substrate and the fixture, the secondary optical element can fall naturally and be positioned above an optoelectric device such as a solar cell or a light-emitting diode. No additional fastener is required for supporting the secondary optical element.

14 Claims, 5 Drawing Sheets

METHOD FOR PACKAGING SECONDARY OPTICAL ELEMENT

FIELD OF THE INVENTION

The present invention relates generally to a method for packaging, and particularly to a method for packaging secondary optical element, which makes a fastener for the packaged product unnecessary by using an auxiliary fixture and a flip technique.

BACKGROUND OF THE INVENTION

The fundamental operation method of solar power generation is to illuminate sunlight on the surface of solar cells. Currently, in order to increase the power generating efficiency, there are concentrating solar cell modules, which adopt a concentrating lens for concentrating a great deal of photovoltaic energy. These concentrating solar cell modules can shrink the size of solar cells and thus saving the materials of cells by increasing the concentrating multiple and using automatic production.

In practice, secondary optical elements, such as spherical lenses, should be used together with small-area solar cells in the concentrating solar cell modules for shrinking the concentrating light spot as well as increasing the angle tolerance of sunlight. Nonetheless, the present method for fixing spherical lenses is difficult and complicated. Current general secondary optical elements are components with high light perviousness and hardness, including metal materials or glass. If metals are adopted for fabricating secondary optical elements, screw fastening is required for installation, which consumes a substantial amount of labor and components such as screws. On the other hand, if glass materials are adopted, while combining the secondary optical elements with the solar cell chips on the circuit board, the primary optical glue should be applied first for protecting the surfaces of solar cell chips and the thin metal conductive wires.

Mass production of secondary optical elements is usually performed by using molds. While forming using a mold, some part of a secondary optical element should be provided for thimble contact, so that the formed secondary optical element can be pushed out of the mold by a thimble. Nonetheless, if the thimble contacts directly the optical region of the secondary optical element, namely, the region responsible for the optical function of the secondary optical element, the shape of the optical region will be destroyed, resulting in damages of the secondary optical element. Accordingly, an additional block is provided for thimble contact. Unfortunately, this additional block makes the general fixture not applicable to the secondary optical element.

SUMMARY

An objective of the present invention is to provide a method for packaging secondary optical element, which requires no additional fastener for fixing a packaged secondary optical element. Only the optical glue is required for jointing.

Another objective of the present invention is to provide a method for packaging secondary optical element, which can be applied extensively to packaging optoelectric devices such as solar cells or light-emitting diodes.

In order to achieve the objectives described above, the present invention discloses a method for packaging secondary optical element, which packages a secondary optical element above an optoelectric device. The optoelectric device is fixed on a substrate and covered by hardened first optical glue. The method comprises steps of: positioning the secondary optical element using a fixture, a bottom surface of the secondary optical element facing up, and the bottom surface covered by hardened second optical glue; flipping the substrate vertically to turn the optoelectric device facing down and enable the first optical glue to contact the second optical glue; flipping the substrate and the fixture vertically to lower the secondary optical element towards the direction of the optoelectric device; and hardening the second optical glue.

DETAILED DESCRIPTION

In order to make the structure and characteristics as well as the effectiveness of the present invention to be further understood and recognized, the detailed description of the present invention is provided as follows along with embodiments and accompanying figures.

According to the method for packaging secondary optical element of the present invention, a secondary optical element is packaged above an optoelectric device such as a light-emitting diode or a solar cell. The difference is only on the different operational principles of the optoelectric devices and the direction by which the light passes through the secondary optical element. In the following embodiment of the present invention, a solar cell is taken as an example. The steps that follow will undoubtedly be applied to a light-emitting diode as well.

Figure 1:
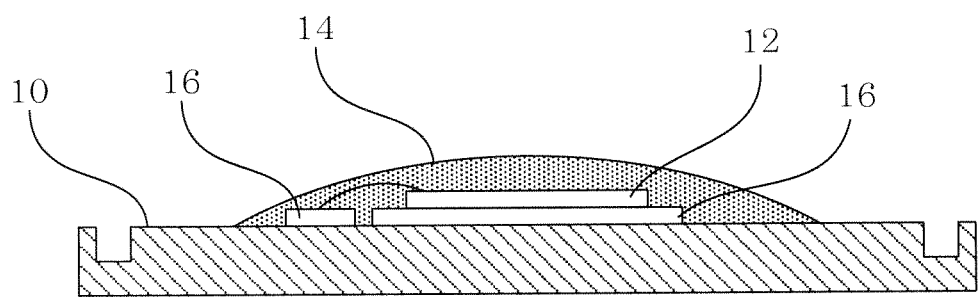
FIG. 1 shows a structural schematic diagram of fixing a solar cell on a substrate and covered by hardened first optical glue according to a preferred embodiment of the present invention.

Please refer to FIG. 1 first. A solar cell 12 is fixed on a substrate 10 and covered by hardened first optical glue 14. The material of the first optical glue 14 is high-transmissivity and insulating glue. It can be hardened by placing at room temperature, heating, or ultraviolet illumination. According to the present invention, before packaging the secondary optical element, the first optical glue 14 is already hardened for completing packaging of the solar cell 12.

In the first optical glue 14, in addition to the solar cell 12, the packaged devices also include the circuit structure 16 located between the solar cell 12 and the substrate 10. The circuit structure 16 can be a plurality of metal electrodes and gold wires. The solar cell 12 and the circuit structure 16 are connected electrically, so that the electric power generated by the solar cell 12 can be transmitted outwards.

Figure 2:
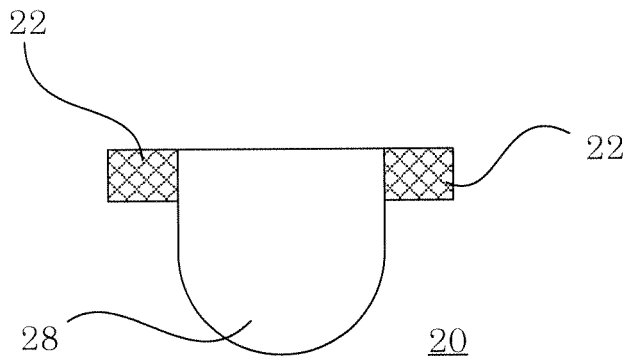
FIG. 2 shows a structural schematic diagram of the secondary optical element having a lug according to a preferred embodiment of the present invention.
Figure 3:
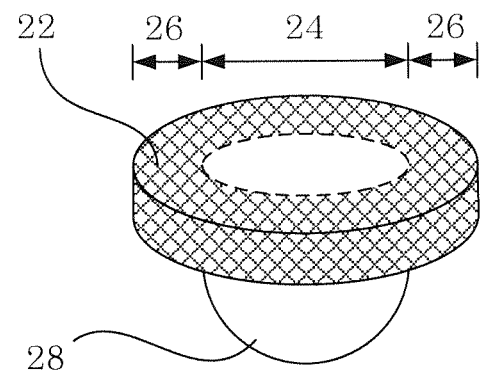
FIG. 3 shows a structural schematic diagram of the secondary optical element having an optical region and a non-optical region according to a preferred embodiment of the present invention.

By using the first optical glue 14, the solar cell 12 and the circuit structure 16 are packaged on the substrate 10. On the other hand, a fixture is used for positioning the secondary optical element 20. Please refer to FIGS. 2 and 3. The secondary element 20 to be packages according to the present invention is a light-pervious hemisphere, sphere, or bullet-shaped member made of glass, quartz, plastics, acrylics, or glue. It includes a lug in its structure. The main part of the secondary optical element 20 can be divided into an optical region 24 and anon-optical region 26 (the grid area in the figures). Overall, the secondary optical element 20 owns the characteristics of a spherical lens. According to the present embodiment of the present invention, the optical area 24 is bullet-shaped. The front of the optical area 20 is a hemisphere 28 for collecting the photo energy focused by the concentrating lens, so that the area of the concentrated sunlight spot can be further shrunk in the concentrating solar cell module and thus increasing the angle tolerance of sunlight shift. On the other hand, the non-optical area 26 is not situated on the main light path and does not provide the functions of concentrating photo energy and light path. Instead, it provides non-optical functions such as auxiliary positioning.

Furthermore, the structure of the lug 22 described above is located in the non-optical area 26. In the rapid, mass, and low-cost production of the secondary optical elements 20, a region should be provided in mold forming for thimble pushing. Thereby, to avoid damages on the shapes of the optical elements by contacting thimbles on the optical area 24 directly, the non-optical area 26 is designed additionally. This non-optical area 26 shows the structural characteristics of the lug 22.

The method for packaging according to the present invention is based on the devices and structural characteristics described above, and comprises the following steps:

Step S10: Positioning the secondary optical element using a fixture, a bottom surface of the secondary optical element facing up, and the bottom surface covered by hardened second optical glue;

Step S20: Flipping the substrate vertically to turn the optoelectric device facing down and enable the first optical glue to contact the second optical glue;

Step S30: Flipping the substrate and the fixture vertically to lower the secondary optical element towards the direction of the optoelectric device;

Step S40: Hardening the second optical glue; and

Step S50: Removing the fixture.

Figure 4:
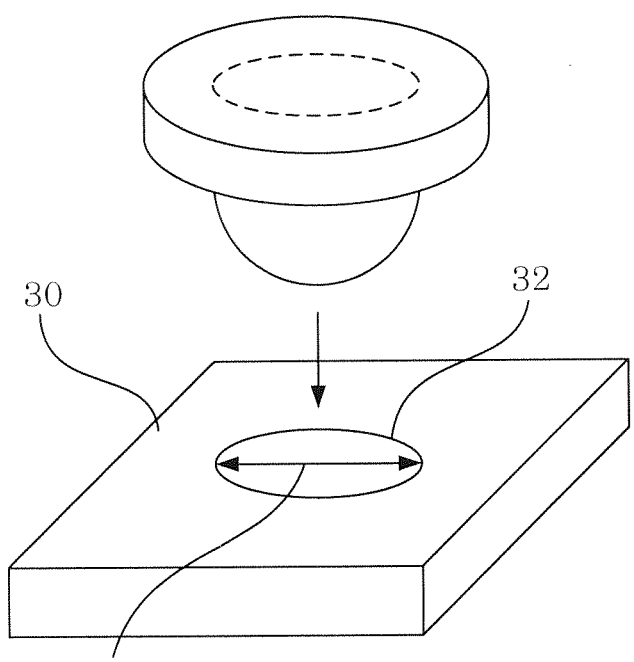
FIG. 4 shows a process step of inserting the secondary optical element into the positioning hole of a fixture according to a preferred embodiment of the present invention.

Please refer to FIG. 4. The fixture 30 used in the present invention includes a positioning hole 32 (this is figure is used for showing the positioning hole of the fixture only). In the step S10, the secondary optical element 20 is inserted in to the positioning hole 32 of the fixture 30. The diameter R1 of the positioning hole 32 is not less than the inner diameter R2 of the lug 22 of the secondary optical element 20. The preferred size is that R1 is slightly greater than R2, so that the secondary optical element 20 will not shake laterally after being inserted into the positioning hole 32 but still be able to slide up and down. The lug 22 of the secondary optical element 20 will be against a surface of the fixture 30.

While positioning the secondary optical element 20 in the step, its bottom surface faces upwards. Thereby, the lug 22 moves downwards naturally and is against a surface of the fixture 30. Besides, the bottom surface 21 is not covered by unhardened second optical glue 36.

Figure 5:
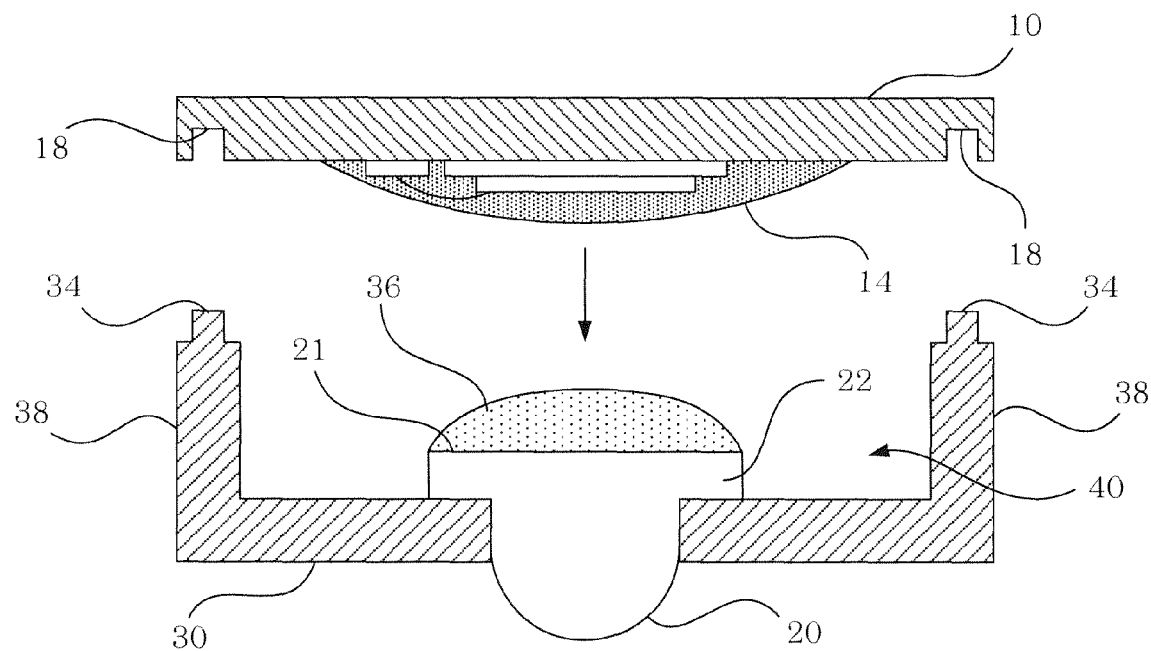
FIG. 5 shows a process step of moving the substrate downwards to make the first optical glue contact the second optical glue according to a preferred embodiment of the present invention.

Next, in the step S20, the substrate 10 is flipped vertically to make the solar cell 12, which faces upwards originally, face downwards, and to make the first optical glue 14 move downwards to contact the second optical glue 36. Please refer to FIG. 5. The substrate 10 according to the present invention includes at least a mortise 18. The fixture 30 further includes at least a tenon 34. When the substrate 10 is flipped vertically in this step, the tenons 34 joint the mortises 18, respectively, and thus jointing the substrate 10 and the fixture 30. By using the vertical frame 38 of the fixture 30, a space 40 is divided. In addition, the mortises 34 are located on the frame 30 of the fixture 30.

Figure 6:
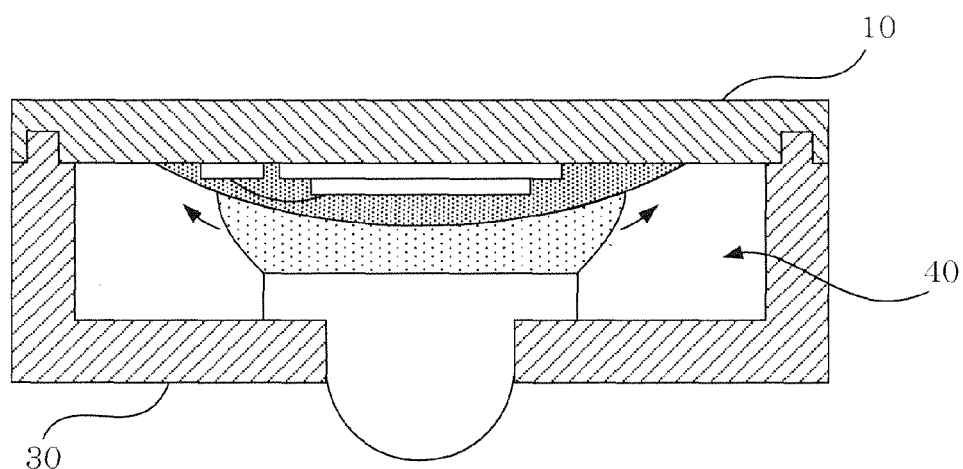
FIG. 6 shows a process step in which the first optical glue has contacted the second optical glue according to a preferred embodiment of the present invention.

FIG. 6 shows a schematic diagram of the jointed substrate 10 and the fixture 30. Because the first optical glue 14 is hardened, when the first optical glue 14 contacts the second optical glue 36, the shape of the first optical glue 14 will not change. Nonetheless, because the second optical glue 36 is not hardened at this moment, it will be squeezed by the first optical glue 14 and flow along the surface of the first optical glue 14.

Figure 7:
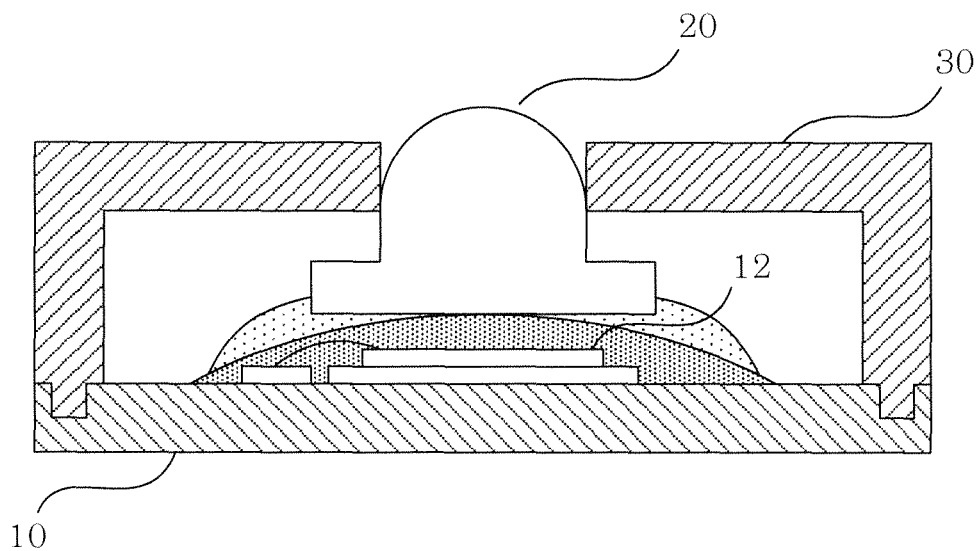
FIG. 7 shows a structural schematic diagram of the vertically flipped substrate and the fixture according to a preferred embodiment of the present invention.

In the step S30, the jointed substrate 10 and the fixture 30 are flipped simultaneously so that the lug 22 of the secondary optical element 20 is no longer against one surface of the fixture 30. Instead, the lug 22 can fall naturally. By taking advantage of its own weight, the secondary optical element 20 squeezes the second optical glue 36 and is lowered towards the direction of the solar cell 12. As shown in FIG. 7, the secondary optical element 20 is lowered to the surface of the hardened first optical glue 14. Based on the design of the fixture 30, the secondary optical element 20 is aligned above the solar cell 12. Thereby, in the step S30, the secondary optical element 20 will be positioned above the solar cell 12.

Figure 8:
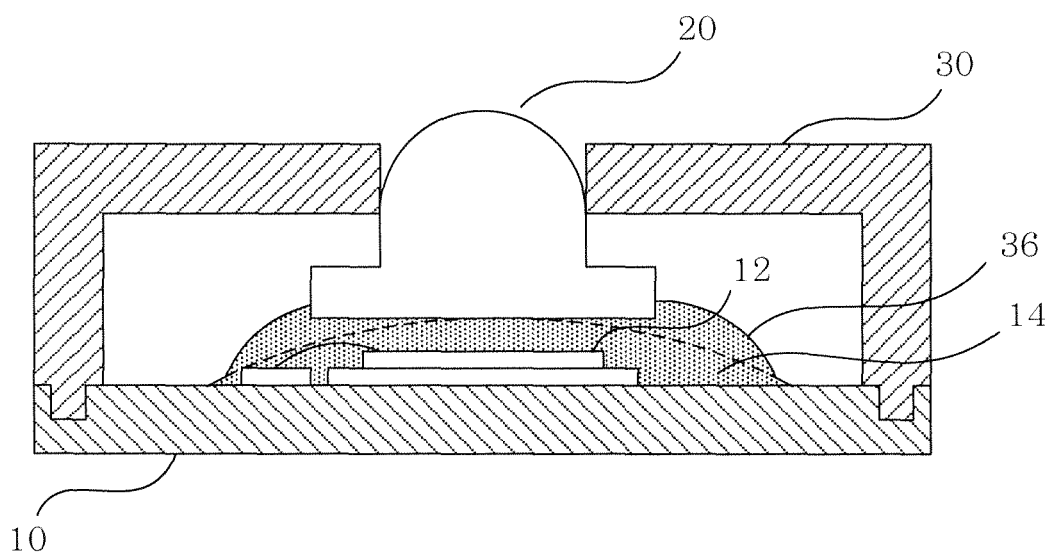
FIG. 8 shows a structural schematic diagram of the hardened optical glue according to a preferred embodiment of the present invention.
Figure 9:
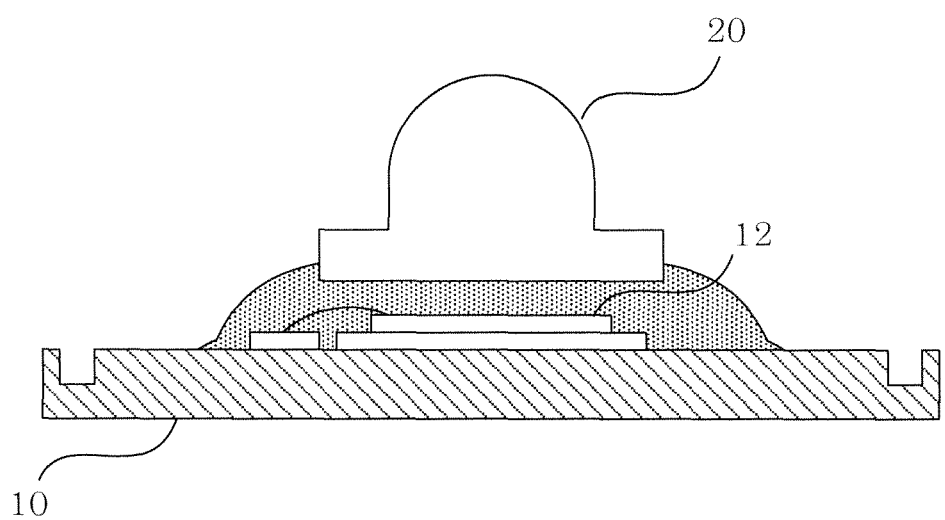
FIG. 9 shows a structural schematic diagram after the fixture is removed according to a preferred embodiment of the present invention.

In the step S40, the second optical glue 36 is hardened by high-temperature baking or ultraviolet illumination for fixing the secondary optical element 20 above the solar cell 12. As shown in FIG. 8, the hardened second optical glue 36 integrates with the earlierly-hardened first optical glue 14 and forming a complete optical glue block. Finally, in the step S50, the fixture 30 is removed. FIG. 9 shows a schematic diagram of the packaged the secondary optical element 20 after the fixture 30 is removed. The secondary optical element 20 has the focusing effect of a spherical lens. Thereby, the incident sunlight can be focused by the secondary optical element 20 and concentrated on the surface of the solar cell 12. In other words, together with the Fresnel lens and the secondary optical element 20, the area of the concentrated sunlight spot can be further shrunk in the concentrating solar cell module and thus increasing the angle tolerance of sunlight shift.

To sum up, the present invention discloses a method for packaging secondary optical element. By coating optical glue at two sites and hardening individually as well as using the technical characteristics of flipping the substrate and the fixture, the secondary optical element can fall naturally and be positioned above an optoelectric device such as a solar cell or a light-emitting diode. The package quality of the finished product is excellent with high reliability and mass productivity. Thereby, the method for packaging secondary optical element according to the present invention truly provides practical values.

Accordingly, the present invention conforms to the legal requirements owing to its novelty, nonobviousness, and utility. However, the foregoing description is only embodiments of the present invention, not used to limit the scope and range of the present invention. Those equivalent changes or modifications made according to the shape, structure, feature, or spirit described in the claims of the present invention are included in the appended claims of the present invention.

The invention claimed is:

1. A method for packaging secondary optical element, packaging a secondary element above an optoelectric device fixed on a substrate and covered by hardened first optical glue, and comprising steps of:
    positioning said secondary optical element using a fixture, a bottom surface of said secondary optical element facing up, and the bottom surface covered by hardened second optical glue;
    flipping said substrate vertically to turn said optoelectric device facing down and enable said first optical glue to contact said second optical glue;
    flipping said substrate and said fixture vertically to lower said secondary optical element towards the direction of said optoelectric device; and
    hardening said second optical glue.

2. The method for packaging secondary optical element of claim 1, wherein said optoelectric device is a solar cell or a light-emitting diode.

3. The method for packaging secondary optical element of claim 1, wherein a circuit structure is included between said optoelectric device and said substrate, and said optoelectric device is connected electrically with said circuit structure.

4. The method for packaging secondary optical element of claim 3, wherein said circuit structure includes at least a gold wire.

5. The method for packaging secondary optical element of claim 3, wherein said first optical glue further covers said circuit structure.

6. The method for packaging secondary optical element of claim 1, wherein said substrate includes at least a mortise.

7. The method for packaging secondary optical element of claim 6, wherein said fixture includes at least a tenon jointing said mortise in said step of flipping said substrate vertically to turn said optoelectric device facing down.

8. The method for packaging secondary optical element of claim 6, wherein said tenon is located on a frame of said fixture.

9. The method for packaging secondary optical element of claim 1, and further comprising a step of removing said fixture after said step of hardening said second optical glue.

10. The method for packaging secondary optical element of claim 1, wherein said secondary optical element includes a lug.

11. The method for packaging secondary optical element of claim 10, wherein said secondary optical element is inserted into a positioning hole of said secondary optical element with a diameter not less than the inner diameter of said lug in said step of positioning said secondary optical element using said fixture.

12. The method for packaging secondary optical element of claim 10, wherein said secondary optical element includes an optical region and a non-optical region situated on said lug.

13. The method for packaging secondary optical element of claim 1, wherein said secondary optical element has the characteristics of a spherical lens.

14. The method for packaging secondary optical element of claim 1, wherein said secondary optical element is lowered to the surface of said first optical glue in said step of flipping said substrate and said fixture vertically to lower said secondary optical element towards the direction of said optoelectric device.

* * * * *